United States Patent
Yasuda et al.

(10) Patent No.: US 11,646,458 B2
(45) Date of Patent: May 9, 2023

(54) BUSBAR MODULE

(71) Applicant: Yazaki Corporation, Tokyo (JP)

(72) Inventors: Tomoji Yasuda, Makinohara (JP); Yoshiaki Ichikawa, Makinohara (JP); Tatsuya Oga, Makinohara (JP)

(73) Assignee: Yazaki Corporation, Tokyo (JP)

( * ) Notice: Subject to any disclaimer, the term of this patent is extended or adjusted under 35 U.S.C. 154(b) by 454 days.

(21) Appl. No.: 15/930,982

(22) Filed: May 13, 2020

(65) Prior Publication Data

US 2020/0395590 A1    Dec. 17, 2020

(30) Foreign Application Priority Data

Jun. 17, 2019 (JP) .............. JP2019-112234

(51) Int. Cl.
| | |
|---|---|
| *H01M 10/48* | (2006.01) |
| *H01M 10/42* | (2006.01) |
| *H05K 1/02* | (2006.01) |
| *H01M 50/507* | (2021.01) |
| *H01M 50/524* | (2021.01) |
| *H01M 50/522* | (2021.01) |
| *H01M 50/209* | (2021.01) |

(52) U.S. Cl.
CPC ....... *H01M 10/482* (2013.01); *H01M 10/425* (2013.01); *H01M 50/507* (2021.01); *H01M 50/522* (2021.01); *H01M 50/524* (2021.01); *H05K 1/028* (2013.01); *H01M 50/209* (2021.01); *H01M 2220/20* (2013.01)

(58) Field of Classification Search
CPC combination set(s) only.
See application file for complete search history.

(56) References Cited

U.S. PATENT DOCUMENTS

| 5,144,534 A | 9/1992 | Kober |
| 9,147,875 B1 * | 9/2015 | Coakley ............... H05K 1/189 |
| 2005/0110458 A1 | 5/2005 | Seman et al. |
| 2014/0370343 A1 | 12/2014 | Nomoto et al. |

(Continued)

FOREIGN PATENT DOCUMENTS

| CN | 105636366 A | 6/2016 |
| CN | 107710884 A | 2/2018 |

(Continued)

*Primary Examiner* — Maria Laios
*Assistant Examiner* — Jordan E Berresford
(74) *Attorney, Agent, or Firm* — Banner & Witcoff, Ltd.

(57) ABSTRACT

A busbar module includes: a circuit body having a flexible circuit board; busbars; and a holder. The circuit body has: conductor layers and protective layers to form a multiple-layered structure of wiring patterns; a band-shaped main strip to be located to extend in a stacking direction of cells; and a band-shaped branch strip branched from the main strip. The branch strip has: a bent portion extending in the stacking direction and having a bent shape around an axis crossing the stacking direction; and a connection portion disposed closer to an end of the branch strip than the bent portion and connected to the corresponding busbar. The bent portion has a thin-layer portion having a shape formed by removing, from the flexible circuit board, a part of the protective layers corresponding to a part of the conductor layers without being used as the wiring pattern in the branch strip.

2 Claims, 13 Drawing Sheets

(56) References Cited

U.S. PATENT DOCUMENTS

| | | |
|---|---|---|
| 2015/0027754 A1 | 1/2015 | Shimoda et al. |
| 2016/0150636 A1 | 5/2016 | Otsubo |
| 2016/0254515 A1* | 9/2016 | Shimoda ............... H01M 2/206 |
| | | 429/61 |
| 2018/0088179 A1 | 3/2018 | Ota et al. |
| 2018/0130989 A1 | 5/2018 | Saito et al. |
| 2018/0190960 A1 | 7/2018 | Harris et al. |
| 2018/0192511 A1 | 7/2018 | Tsumagari et al. |
| 2018/0248167 A1 | 8/2018 | Hashizawa et al. |
| 2019/0181418 A1 | 6/2019 | Son et al. |

FOREIGN PATENT DOCUMENTS

| | | |
|---|---|---|
| CN | 207781834 U | 8/2018 |
| EP | 2020833 A1 | 2/2009 |
| JP | 2014-220128 A | 11/2014 |
| JP | 2015-022965 A | 2/2015 |
| JP | 2015-185226 A | 10/2015 |
| JP | 6040728 B2 | 12/2016 |
| WO | 2019-059133 A1 | 3/2019 |

* cited by examiner

BUSBAR MODULE

CROSS-REFERENCES TO RELATED APPLICATION(S)

This application is based on and claims priority from Japanese Patent Application No. 2019-112234 filed on Jun. 17, 2019, and the entire contents of which are incorporated herein by reference.

BACKGROUND

Field of the Invention

The present invention relates to a busbar module.

Description of Related Art

Conventionally, busbar modules are used in such a manner as to be attached to a battery assembly (i.e., a battery module in which plural battery cells are laid on each other) that is a drive power source installed in an electric vehicle, a hybrid vehicle, or the like.

The busbar module disclosed in Patent document 1 is equipped with plural busbars each of which connects a positive electrode and a negative electrode of adjacent ones of battery cells laid on each other and voltage detection lines that are connected to the respective busbars and serve to monitor the individual battery cells. The voltage detection lines are a bundle of plural electric wires each having a common structure that a core wire is covered with an insulating covering.

As for details of the above connector, refer to JP 2014-220128 A.

SUMMARY

Incidentally, in general, battery cells constituting a battery assembly expand and contract in the stacking direction due to heat generated in association with charging and discharging, an environment temperature, etc. As a result, the battery assembly (battery module) is also deformed, that is, expands and contracts, in the battery cells stacking direction. Furthermore, in general, the size of a battery assembly in the stacking direction may vary from one battery assembly manufactured to another (manufacture dispersion) due to an assembling allowance of stacking of plural battery cells. To accommodate such deformation of the battery assembly and manufacture dispersion, in general, busbar modules are designed in such a manner that the lengths of the voltage detection lines have certain margins.

However, in the above conventional busbar module, in the case where the number of battery cells laid on each other is increased to, for example, increase the capacity of the battery assembly, the number of electric wires constituting the voltage detection lines is also increased. As a result, when the voltage detection lines are formed by bundling such a large number of electric wires, the stiffness of all the voltage detection lines (and hence the stiffness of the busbar module) is increased, which makes it difficult to increase the efficiency of work of attaching the busbar module to the battery assembly (the ease of attachment). For the same reason, it may become difficult for the busbar module to expand and contract to absorb deformation and manufacture dispersion of the battery assembly sufficiently.

An object of the invention is therefore to provide a busbar module that is high in the ease of attachment to a battery assembly and the followability to deformation and manufacture dispersion of the battery assembly.

Embodiments of the present invention provide the following items [1] to [3]:

[1] A busbar module to be attached to a battery assembly having a stack of a plurality of cells, the busbar module comprising:
a circuit body having a flexible circuit board including wiring patterns; a plurality of busbars to be connected to corresponding electrodes of the plurality of the cells; and a holder holdings the busbars and being extendable in a stacking direction of the plurality of the cells,
the circuit body having:
a plurality of conductor layers and a plurality of protective layers to form a multiple-layered structure of the wiring patterns;
a band-shaped main strip to be located to extend in the stacking direction; and
a band-shaped branch strip branched from the main strip;
the branch strip having:
a bent portion extending in the stacking direction and having a bent shape around an axis crossing the stacking direction; and
a connection portion disposed closer to an end of the branch strip than the bent portion and connected to the corresponding busbar,
the bent portion having a thin-layer portion having a shape formed by removing, from the flexible circuit board, a part of the protective layers corresponding to a part of the conductor layers without being used as the wiring pattern in the branch strip.

[2] The busbar module according to the item [1], wherein
the branch strip has a curved boundary shape between the thin-layer portion and a portion other than the thin-layer portion to be convex to separate from the thin-layer portion in a longitudinal direction of the branch strip.

[3] The busbar module according to the item [1] or the item [2], wherein
a part of the wiring pattern passing through the thin-layer portion is thinner than others of the wiring pattern passing through a portion other than the thin-layer portion.

According to first aspect of the invention, relating to the item [1], the circuit body which is a flexible circuit board has the band-shaped main strip and the band-shaped branch strips which branch off the main strip. At least a portion of each of the branch strips has a bent portion which is bent along an axis that crosses the stacking direction of the plural cells. With this configuration, when the battery assembly expands or contracts in its stacking direction due to thermal deformation of each cell, each busbar can move in the stacking direction of the cells because the bent portion of each branch strip of the circuit body is bent or stretched. Likewise, dispersion of the size of the battery assembly in its stacking direction due to an assembling allowance of each cell can be absorbed by bending or stretching of the bent portions of the branch strips of the circuit body. On the other hand, the bent portion of each branch strip has a thin-layer portion that is formed by removing, from the flexible circuit board, a portion of a protective layer corresponding to a conductor layer not used as a wiring pattern of the branch strip. The thin-layer portion increases the flexibility of the bent portion and thereby facilitates the above bending and stretching. In other words, the busbar module having the above configuration can easily accommodate expansion/contraction and manufacture dispersion of the battery assembly because substantially only the branch strips are deformed with no deformation of the main strip of the circuit body.

In general, even in the case where a flexible circuit board includes a number of circuit structures, it can be deformed flexibly by a much weaker force than the electric wires used in the above-described conventional busbar module. Thus, the ease of attachment of the circuit body to the battery assembly is increased remarkably.

As such, the busbar module having the above configuration is higher in the ease of attachment to the battery assembly and the followability to deformation and manufacture dispersion of the battery assembly.

According to second aspect of the invention, relating to the item [2], the boundaries between the thin-layer portion and portions other than the thin-layer portion are curved so as to be convex toward the sides of the portions other than the thin-layer portion in the longitudinal direction of the branch strip. With this measure, an event that excessive bending stress occurs in portions, located in the vicinity of the boundaries, of a wiring pattern when the branch strip is bent at the boundaries between the thin-layer portion and the portions other than the thin-layer portion can be suppressed. As a result, the wiring patterns can be protected properly even if the thin-layer portion is formed in each branch strip.

According to third aspect of the invention, relating to the item [3], a wiring pattern passing through the thin-layer portion is thinner than wiring patterns that pass through the portions other than the thin-layer portion in the branch strip. This measure increases the flexibility of the thin-layer portion further. As a result, the branch strip is bent and stretched more easily, whereby the busbar module can accommodate expansion/contraction and manufacture dispersion of the battery assembly more easily.

The invention can provide a busbar module that is high in the ease of attachment to a battery assembly and the followability to deformation and manufacture dispersion of the battery assembly.

The invention has been described above concisely. The details of the invention will become more apparent when the modes for carrying out the invention (hereinafter referred to as an embodiment) described below are read through with reference to the accompanying drawings.

BRIEF DESCRIPTION OF THE DRAWINGS

FIG. 8A shows a case that the bent portion assumes a Z shape as a whole, FIG. 8B shows a case that the bent portion assumes a C shape as a whole, and FIG. 8C shows a case that the bent portion assumes an O shape as a whole.

DETAILED DESCRIPTION

Embodiment

A busbar module 10 according to an embodiment of the present invention will be hereinafter described with reference to the drawings. The busbar module 10 according to the embodiment is used being attached to a battery assembly (i.e., a battery module in which plural cells are laid on each other) that is a drive power source installed in an electric vehicle, a hybrid vehicle, or the like.

(Configuration of Battery Assembly 1)

Figure 2:
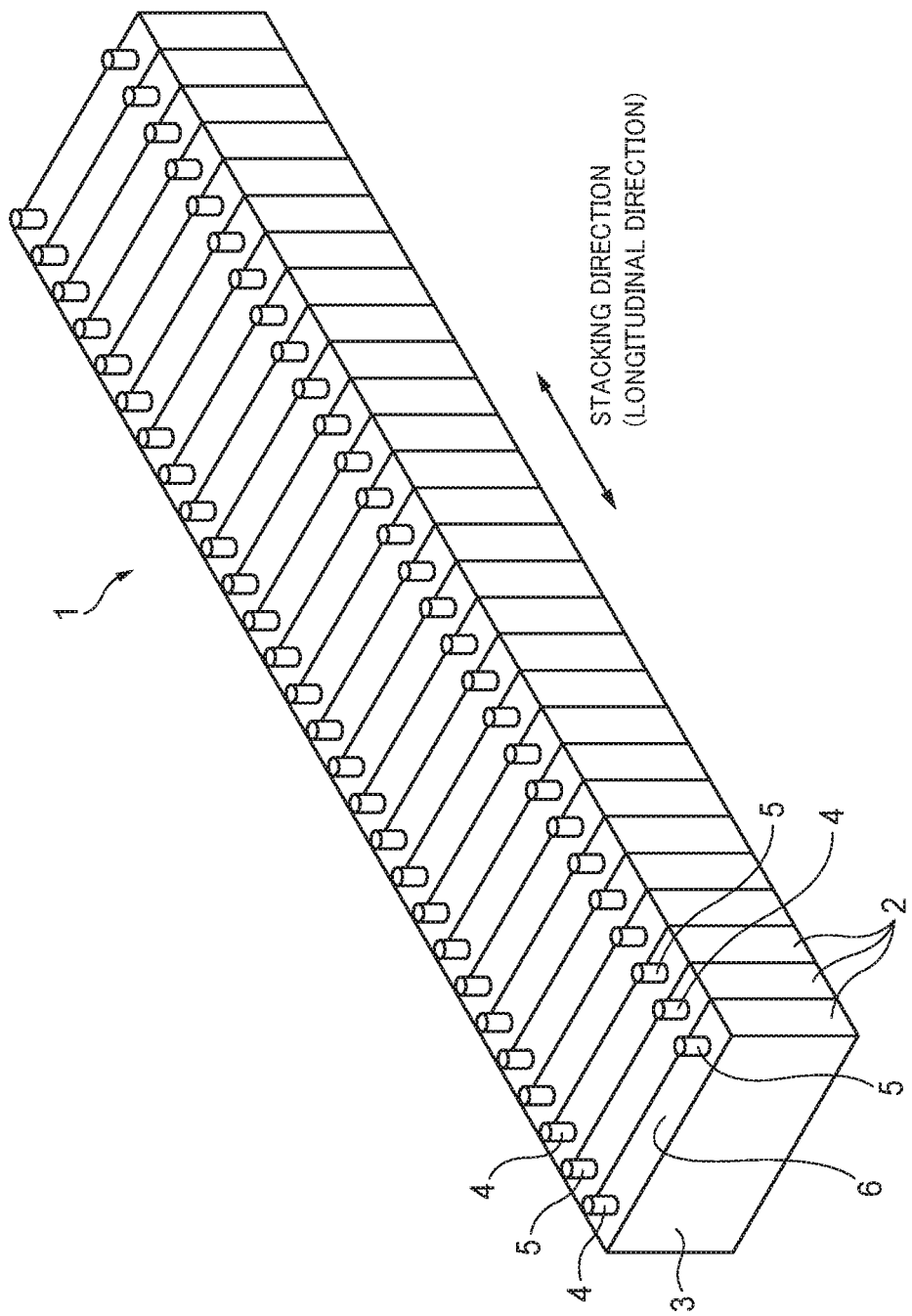
FIG. 2 is a perspective view of a battery assembly to which the busbar module according to the embodiment is to be attached.

First, a battery assembly 1 to which the busbar module 10 according to the embodiment is to be attached will be described. As shown in FIG. 2, the battery assembly 1 is configured in such a manner that plural cells 2 are connected to each other in series. A positive electrode 4 and a negative electrode 5 project from the top of a cuboid-shaped battery main body (main body) 3 of each of the plural cells 2. The positive electrode 4 and the negative electrode 5, which are shaped like a cylinder, are spaced from each other and project upward approximately in the vertical direction from an electrode surface 6 of the battery main body 3.

The battery assembly 1 is configured by laying the cells 2 on each other in a prescribed direction (stacking direction) in such a manner that the positive electrodes 4 and the negative electrodes 5 of the cells 2 are arranged alternately. The positive electrode 4 of one of end cells 2 located at the two respective ends of the series connection of the cells 2 of the battery assembly 1 serves as an assembly positive electrode and the negative electrode 5 of the other end cell 2 serves as an assembly negative electrode.

(Overall Structure of Busbar Module 10)

Figure 1:
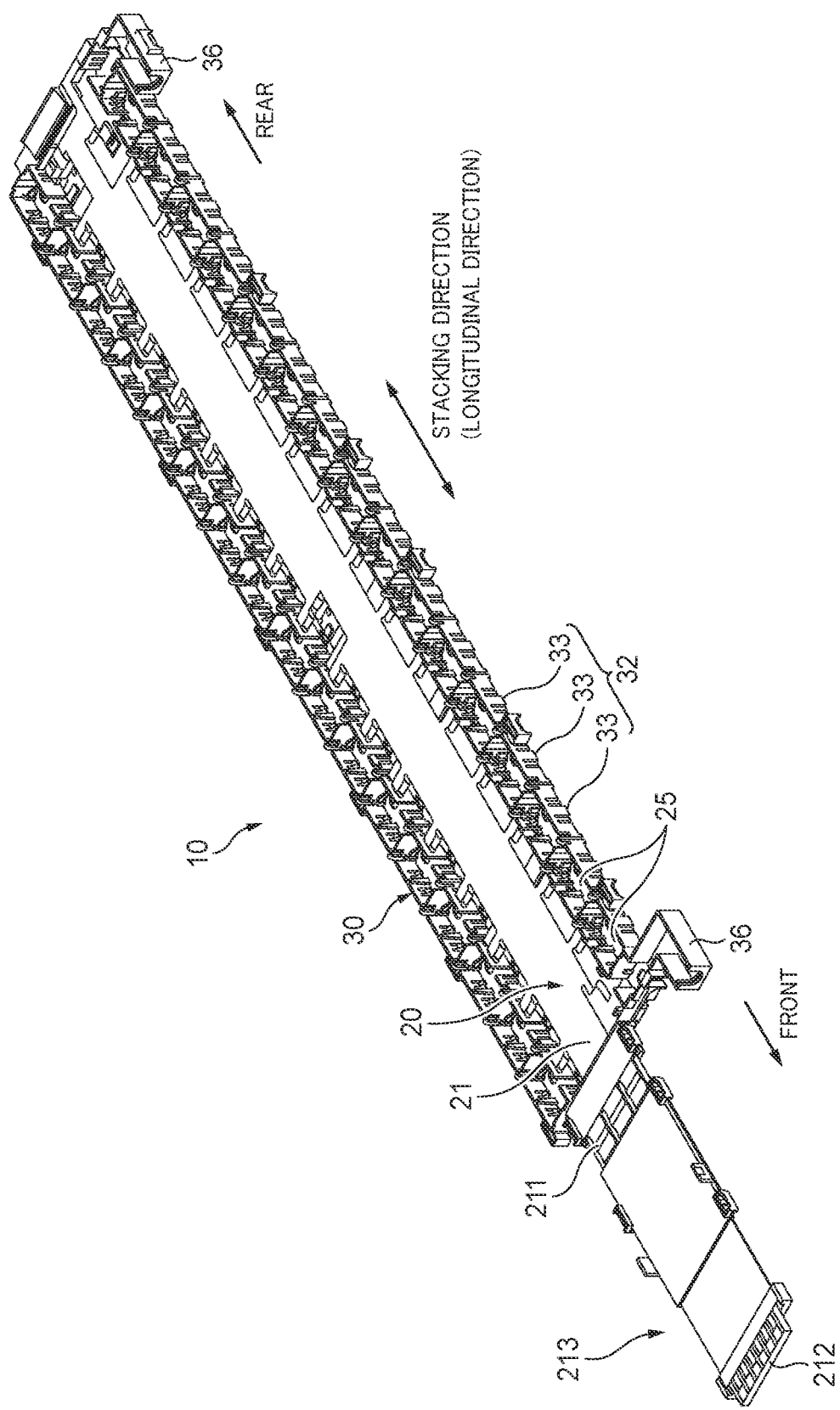
FIG. 1 is a perspective view of the whole of a busbar module according to an embodiment of the present invention.

Next, the busbar module 10 according to the embodiment will be described. As shown in FIG. 1, the busbar module 10 has a circuit body 20 which is a flexible circuit board (FPC) and to which busbars 25 (see FIG. 3) to be connected to the positive electrodes 4 and the negative electrodes 5 of the cells 2 are attached and a holder (electrode routing body) 30 which houses and holds the circuit body 20 and attaches it to the battery assembly 1.

Figure 3:
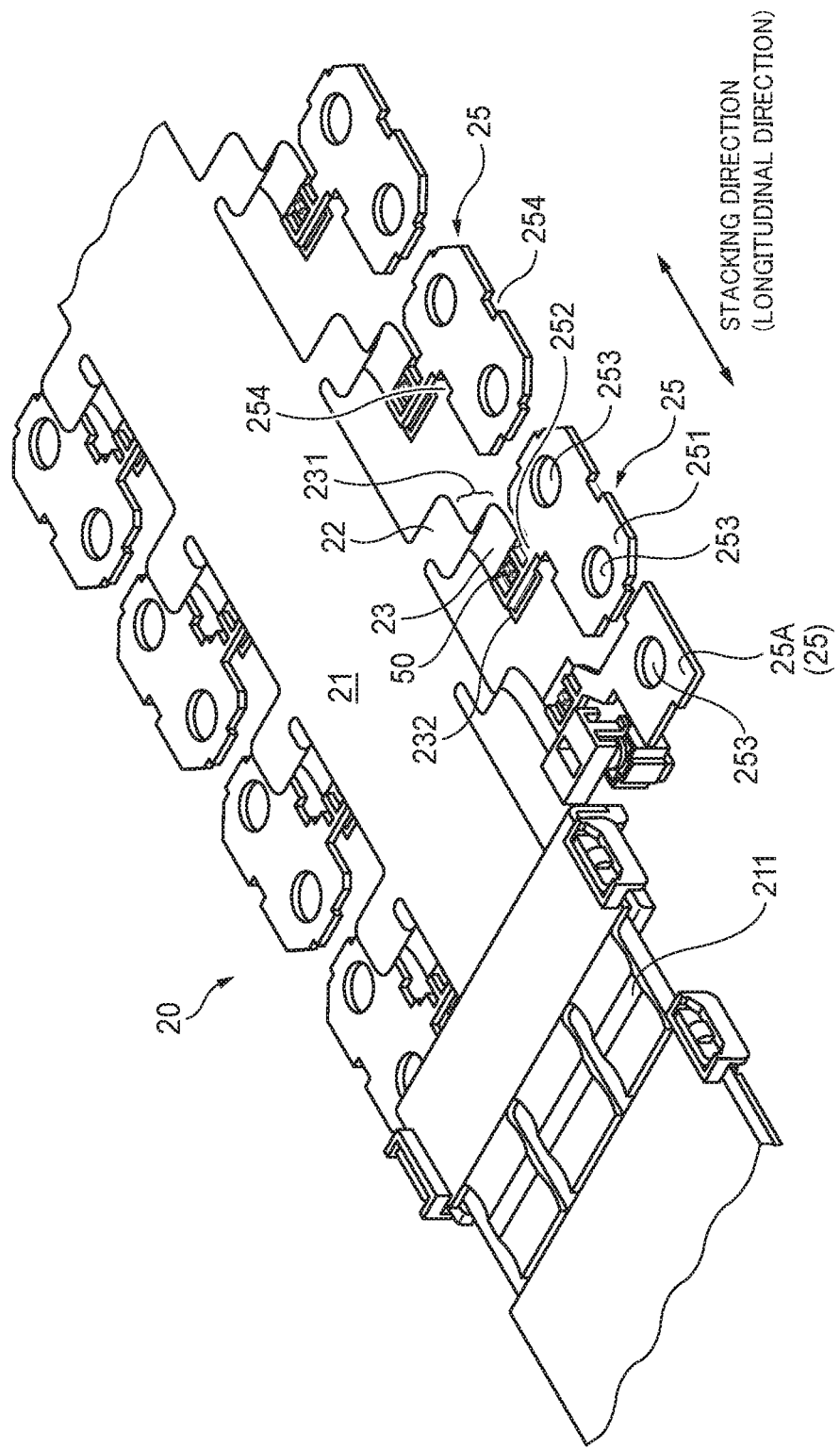
FIG. 3 is an enlarged perspective view of an end portion of a circuit body.

As shown in FIGS. 1 and 3, the circuit body 20 has a band-shaped main strip 21 which is formed with plural wiring patterns (described later in detail) and is to extend over the cells 2 in their stacking direction. A connector 212 is attached to an end portion of the main strip 21 via voltage detection lines 211 which lead out of the main strip 21. The connector 212 can be connected to a voltage detection device (external device, not shown) that is provided outside the busbar module 10.

Branch strips each of which consists of a first branch portion 22 and a second branch portion 23 are connected to side edges, extending parallel with the longitudinal direction (substantially coincident with the stacking direction of the battery assembly 1) of the main strip 21, of the main strip 21. More specifically, band-shaped first branch portions 22 extending in the direction that crosses the longitudinal direction and the thickness direction of the main strip 21 (i.e., outward in the width direction of the main strip 21) are connected to the side edges of the main strip 21. Band-shaped second branch portions 23 extend from the tips of the first branch portions 22, respectively, in parallel with the stacking direction of the battery main bodies 3. The main strip 21, the first branch portions 22, and the second branch portions 23 are an FPC and hence can be deformed flexibly particularly in the direction that is perpendicular to their planes.

Figure 4:
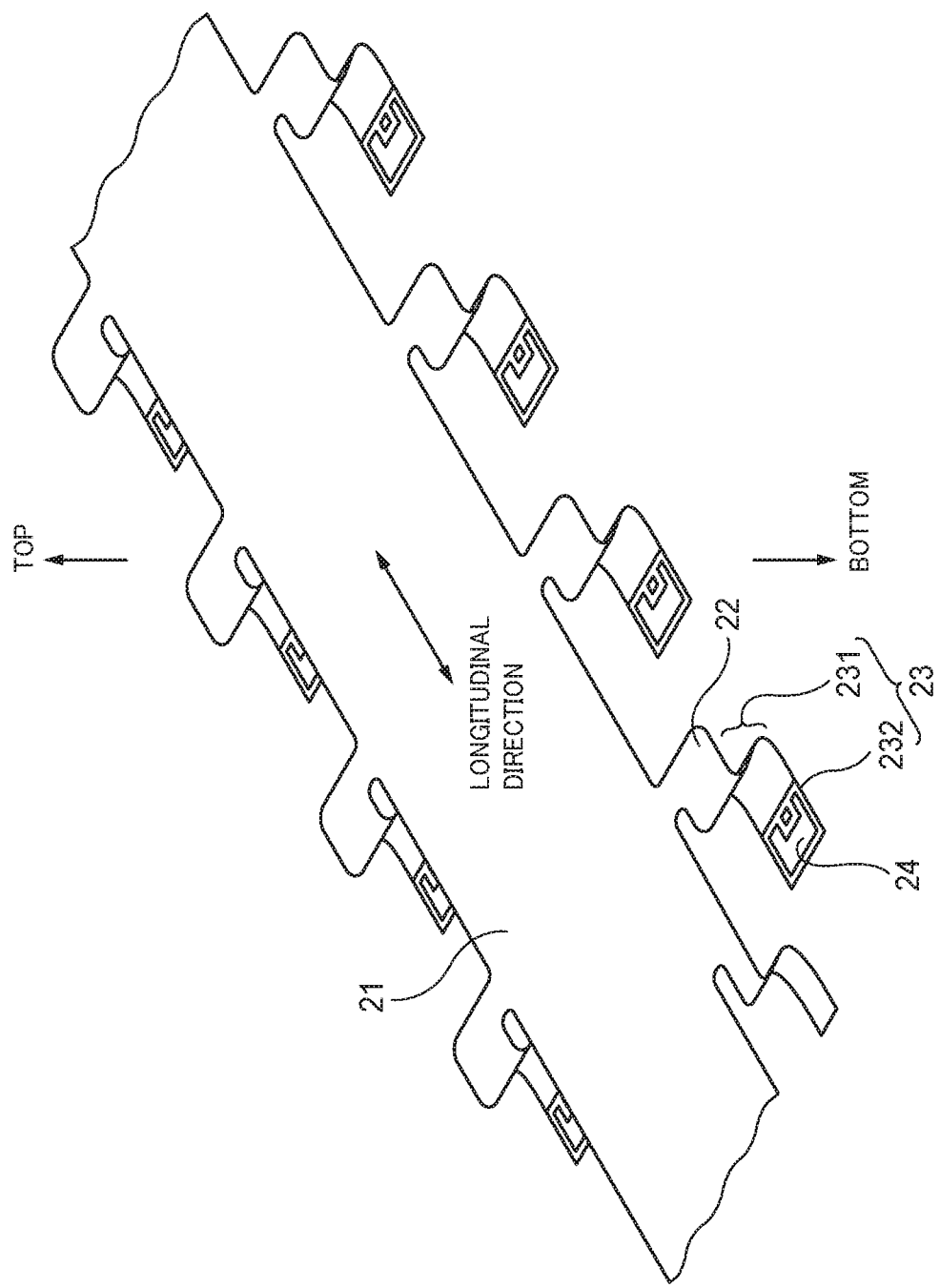
FIG. 4 is a perspective view showing how a main strip, a first branch portion, and a second branch portion of the circuit body are formed.
Figure 5A:
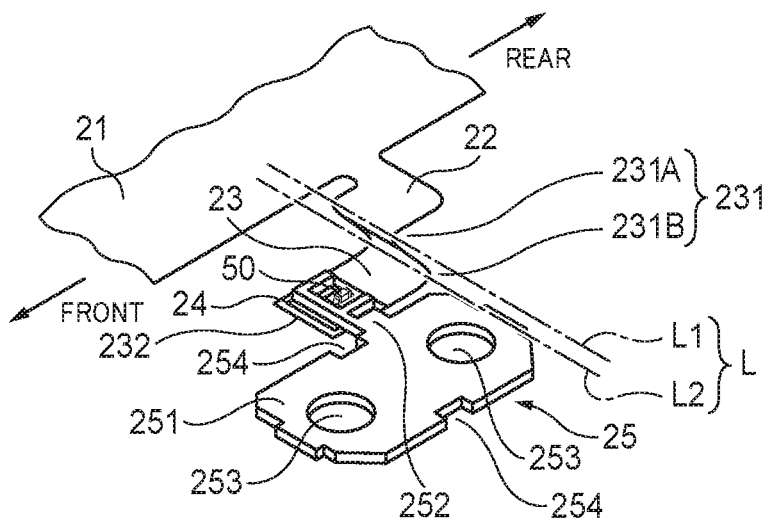
FIG. 5A is a perspective view showing a state that the second branch portion is bent so as to assume an S shape as a whole.

As shown in FIGS. 4 and 5A, each second branch portion 23 has a bent portion 231 which is bent along lines L1 and L2 that cross the stacking direction (in this example, substantially coincident with the extension direction of the second branch portion 23) of the battery assembly 1 (that is, along axes extending parallel with the width direction of the second branch portion 23). Having a first bent portion 231A which is bent along the axis L1 and a second bent portion 231B which is bent along the axis L2, the second branch portion 23 is bent so as to assume an S shape (or an inverted S shape) as a whole. As such, the second branch portion 23 can move in the longitudinal direction of the main strip 21 (i.e., the stacking direction of the battery assembly 1) and expand and contract in the top-bottom direction.

The first branch portions 22 are located outside the main strip 21 in the same plane as the main strip 21, and the second branch portions 23 are connected to the respective first branch portions 22. Thus, the second branch portions 23 are located outside the main strip 21 in its width direction and extend generally downward so as to assume an S shape in a state that there is no deviation between the battery assembly 1 and the circuit body 20 (see FIG. 5A). Thus, the busbars 25 are located outside the main strip 21 in its width direction below the plane of the main strip 21.

An end portion, opposite to the first branch portion 22, of each second branch portion 23 is a tip portion 232 having a plane that is approximately parallel with the main strip 21, and a connection portion 24 is attached to the top surface of the tip portion 232. The bottom surface of the connection portion 24 is parallel with and at a different height as the bottom surface of the main strip 21, and hence these bottom surfaces are spaced from each other. The top surface of the connection portion 24 is connected to a busbar 25 that connects a positive electrode 4 and a negative electrode 5 of adjacent cells 2 of the battery assembly 1. Since the second branch portion 23 is thus connected to the electrodes 4 and 5 of those cells 2 via the connection portion 24 and the busbar 25, the associated voltage detection line 211 is connected to the electrodes 4 and 5.

As shown in FIGS. 3 and 5A, each busbar 25 is a plate-like conductive member (made of copper, for example) and has a busbar main body 251 which is rectangular as a whole and a connection piece 252 which projects from the busbar main body 251 to the side of the main strip 21. Two electrode holes 253 into which a positive electrode 4 and a negative electrode 5 of adjacent cells 2 are to be inserted, respectively, penetrate through the busbar main body 251. The side edge located on the side of the main strip 21 and the opposite side edge of the busbar main body 251 are formed with respective positioning recesses 254 at positions corresponding to the middle between the two electrode holes 253. The connection portion 24 of the second branch portion 23 is connected to the bottom surface of the connection piece 252 of the busbar 25. A specific connection form of the connection piece 252 of the busbar 25 and the connection portion 24 of the second branch portion 23 will be described later.

Busbars 25A that are located at the two respective ends of the main strip 21 in its longitudinal direction are connected to the assembly positive electrode or the assembly negative electrode and are each formed with one electrode hole 253 through which the assembly positive electrode or the assembly negative electrode is to be inserted. Power cables (not shown) for extracting power from the battery assembly 1 are connected to the respective busbars 25A. The internal structures of the main strip 21, the first branch portion 22, and the second branch portion 23 which constitute the circuit body 20 will be described later.

(Structure of Holder 30)

Figure 6:
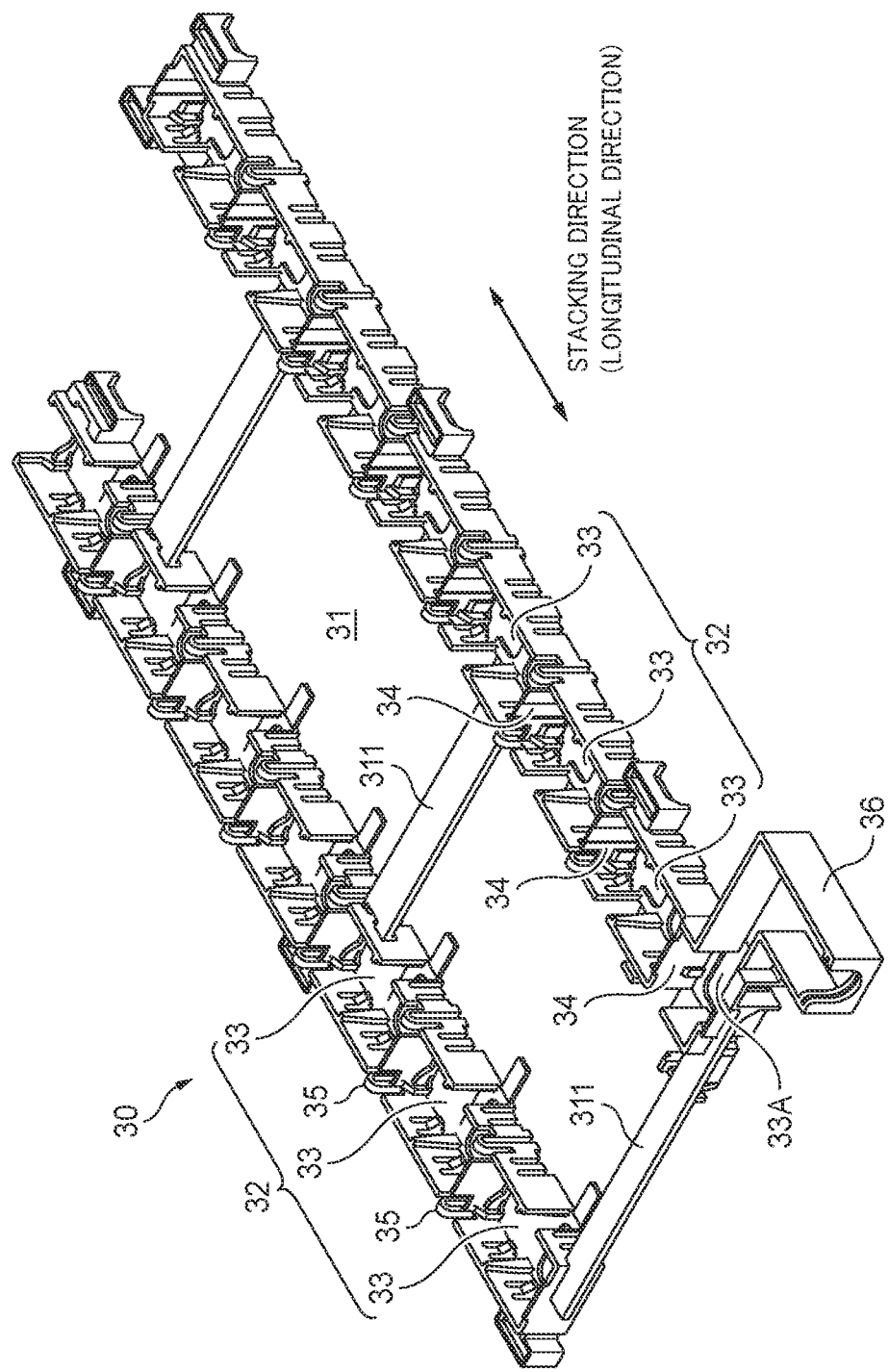
FIG. 6 is a perspective view of part of a holder.

As shown in FIG. 6, the holder 30 is made of a resin, for example, and has, at the center in the width direction, a main strip housing portion 31 which extends in the stacking direction of the cells 2 and houses and holds the main strip 21 of the circuit body 20. The main strip housing portion 31 is provided with main strip support members 311 which are arranged at prescribed intervals in the longitudinal direction of the main strip 21 to be housed. The main strip 21 is put on the main strip support members 311. The main strip support members 311 may be omitted if the main strip 21, the first branch portions 22, and the second branch portions 23 are strong enough to allow the circuit body 20 of this example to be self-supported even if it is not supported by the main strip support members 311. The main strip support members 311 may be provided even in such a case to exercise an auxiliary support function even in a case that the circuit body 20 cannot be self-supported for a certain reason. That is, the circuit body 20 may be either put on and supported by the main strip support members 311 or self-supported without the main strip support members 311.

Figure 7:
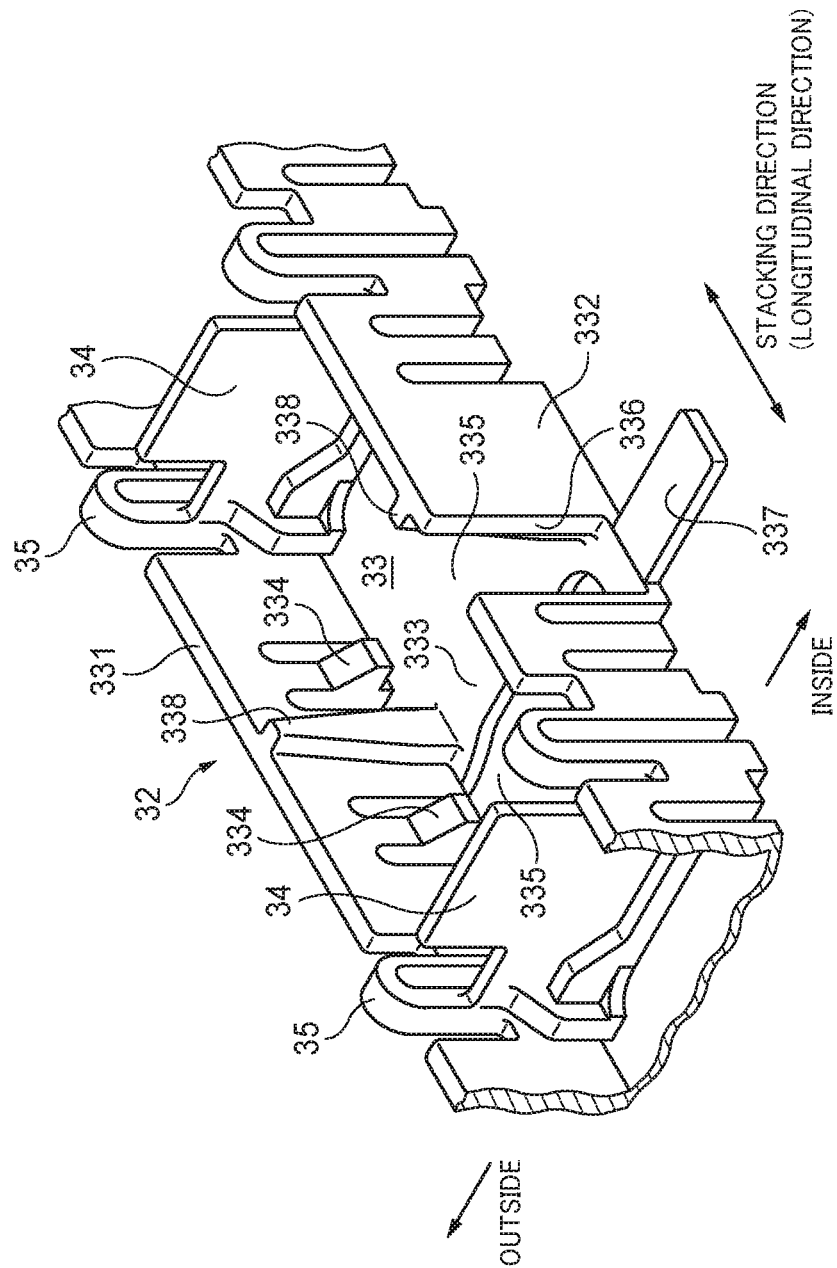
FIG. 7 is a perspective view of a housing space of a busbar housing portion.

Two busbar housing portions 32 for housing the busbars 25 are provided outside the main strip housing portion 31 in the width direction. Each busbar housing portion 32 is provided with plural housing spaces 33 which are to house respective busbars 25 and are arranged in the stacking direction of the cells 2. As also shown in FIG. 7, adjacent housing spaces 33 are bounded by a partition wall 34, whereby the busbars 25 housed there are prevented from coming into contact with each other. Housing spaces 33A for housing the busbars 25A to which the power cables (not shown) are connected, respectively, are provided adjacent to the two respective ends of the main strip 21 in its longitudinal direction, and power cable housing portions 36 are provided so as to be continuous with the respective housing spaces 33A.

As shown in FIG. 7, each housing space 33, which is a rectangular space that is open at the top, is bounded by an outer wall 331 located outside in the width direction, an inner wall 332 located inside in the width direction, and a pair of partition walls 34 located on the two respective ends in the stacking direction. The partition wall 34 located on one side in the stacking direction (the left-side partition wall 34 in FIG. 7) is connected to the outer wall 331 and the inner wall 332 via respective expandable/contractable portions 35. Thus, each housing space 33 can expand and contract in the stacking direction.

Bottom end portions of the outer wall 331 and the inner wall 332 are connected to each other by a connection plate 333. The bottom end portions of the outer wall 331 and the inner wall 332 are formed with lock nails 334 inside, whereby a busbar 25 can be held between the connection plate 333 and the lock nails 334. Projections 338 project inward from the inner side surfaces of the outer wall 331 and the inner wall 332 at the centers in the stacking direction, respectively. The projections 338 serve to position the associated busbar 25 by fitting into the respective positioning recesses 254 (see FIG. 5A) of the busbar 25.

The inner wall 332 is formed with a cut 336 and a support plate 337 projecting inward at a position corresponding to the cut 336. As a result, the connection piece 252 of the busbar 25 housed in the housing space 33 is supported by the support plate 337.

The connection plate 333 is formed with spaces 335 on the two respective sides of the center in the stacking direction. Thus, the positive electrode 4 and the negative electrode 5 of the cells 2 can be exposed in the housing space 33 through the respective spaces 335 and can be connected to the electrode holes 253 of the busbar 25 housed in the housing space 33. A bottom plate may be provided in place of the connection plate 333 so as to be formed with cuts or holes corresponding to the positive electrode 4 and the negative electrode 5 of the cells 2, respectively.

As shown in FIG. 1, the holder 30 houses and holds a portion of the circuit body 20, the portion being located in the rear of a position that is located in the rear of the front end, to which the connector 212 is connected, of the main strip 21 by a prescribed length (i.e., the portion in a range including at least positions where the first branch portions 22 branch off the main strip 21). In other words, a portion (hereinafter referred to as an "exposed portion 213"), having the prescribed length from the front end, to which the connector 212 is connected, of the main strip 21 is not housed in the holder 30 and is exposed from the holder 30.

(Operation of Busbar Module 10)

Figure 5B:
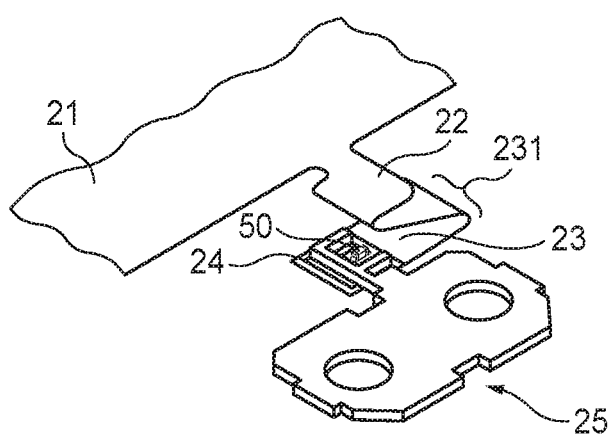
FIG. 5B is a perspective view showing how the second branch portion is deformed when a busbar is moved rearward relatively.
Figure 5C:
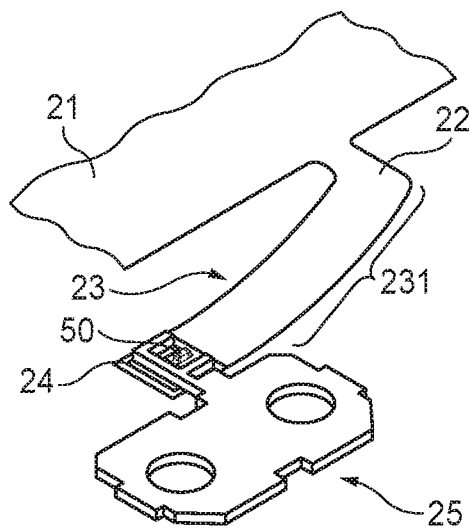
FIG. 5C is a perspective view showing a state that the second branch portion is stretched when the busbar is moved forward relatively.

Next, a description will be made of how the busbar module 10 operates. FIG. 5A shows a state that the second branch portion 23 is bent so as to assume an S shape as a whole, FIG. 5B shows a state that the second branch portion 23 is stretched rearward a little, and FIG. 5C shows a state that the second branch portion 23 is stretched forward.

As described above, the main strip 21 is put on the main strip support members 311 of the holder 30 and hence can move upward and in the longitudinal direction. Although the busbars 25 are housed in the respective housing spaces 33, the housing spaces 33 can move in the longitudinal direction of the main strip 21. The main strip 21 is connected to the busbars 25 via the respective second branch portion 23 which are bent in an S shape (see FIG. 5A).

Even if, for example, the battery assembly 1 is deformed in this state and the relative positional relationship between the battery assembly 1 and the circuit body 20 is changed and the relative positional relationships between the main strip 21 and the busbars 25 are thereby changed, the changes (deviations) in the relative positional relationships can be absorbed by bending or stretching of the second branch portions 23. Likewise, even if the size of the battery assembly 1 in its stacking direction varies from one battery assembly 1 manufactured to another due to an assembling allowance of the plural cells 2, that manufacture dispersion can be absorbed by bending or stretching of the second branch portions 23.

This will be described below more specifically. FIG. 5B shows a case that the busbar 25 has deviated a little rearward (rightward in FIG. 5B) with respect to the main strip 21. In this case, the S shape of the bent portion 231 of the second branch portion 23 is deformed to absorb the deviation of the busbar 25. FIG. 5C shows a case that the busbar 25 has deviated greatly forward (leftward in FIG. 5C) with respect to the main strip 21. In this case, the S shape of the bent portion 231 of the second branch portion 23 is stretched to absorb the deviation of the busbar 25. Although not shown in any drawings, when the main strip 21 is moved upward or downward and its relative positional relationships with the busbars 25 are thereby changed, the S shape of each bent portion 231 is stretched in the top-bottom direction to absorb that changes in the relative positional relationships.

Figure 8A:
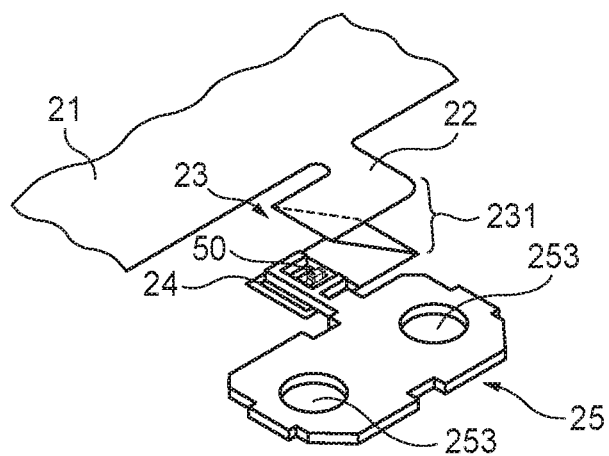
FIGS. 8A-8C are perspective views showing modifications of a bent portion of each second branch portion of the circuit body.
Figure 8B:
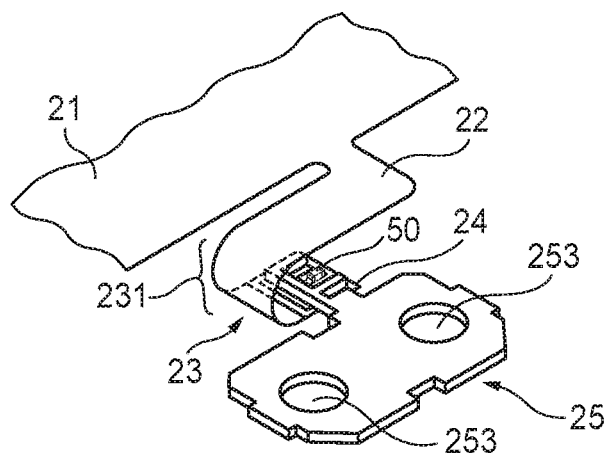
Figure 8C:
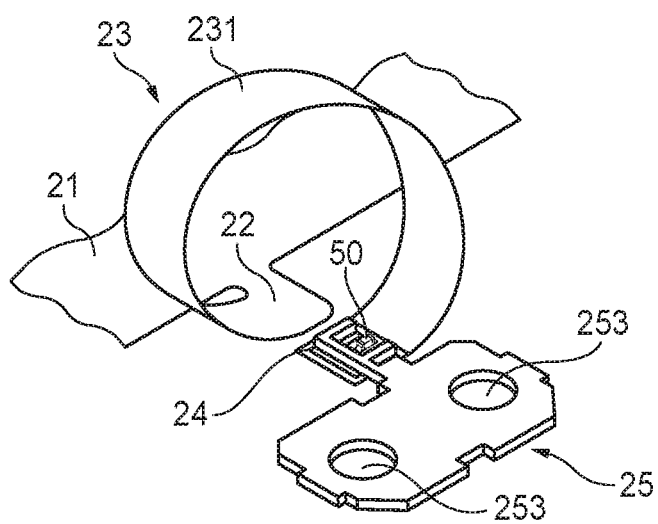

In the above-described embodiment, the bent portion 231 of each second branch portion 23 is bent so as to assume an S shape (or inverted S shape) as a whole. Alternatively, as shown in FIG. 8A, each bent portion 231 may assume a Z shape (or an inverted Z shape) as a whole. As another alternative, as shown in FIG. 8B, each bent portion 231 may be bent so as to assume a C shape (or an inverted C shape) as a whole. As a further alternative, as shown in FIG. 8C, each bent portion 231 may be formed so as to assume an O shape as a whole. As in the example shown in FIG. 8C, if necessary, the branch portions 22 and 23 may be formed so that the bottom surfaces of the main strip 21 and each connection portion 24 are in the same plane.

Figure 9A:
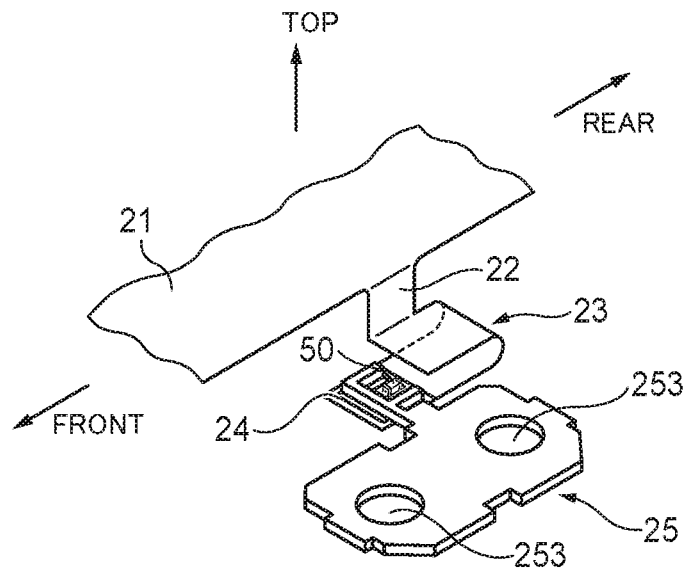
FIG. 9A is a perspective view showing a modification of the first branch portion and FIG. 9B is a perspective view showing a modification of the portion where each branch strip branches off the main strip.
Figure 9B:
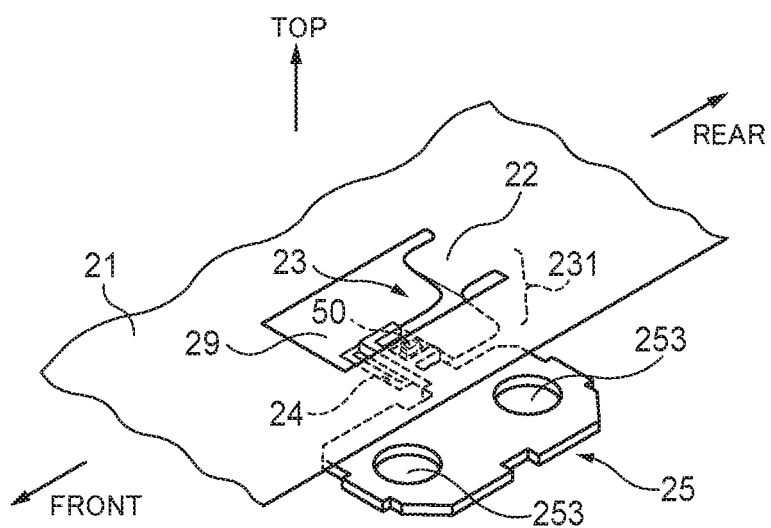

Although in the above embodiment each first branch portion 22 is in the same plane as the main strip 21, as shown in FIG. 9A each first branch portion 22 may extend in such a direction as to cross the bottom surface of the main strip 21 (e.g., in FIG. 9A the first branch portion 22 extends perpendicularly to the main strip 21, more specifically, downward). Although in the above-described embodiment each first branch portion 22 branches off the main strip 21 from its side edge, another alternative is possible in which as shown in FIG. 9B openings 29 are formed inside the main strip 21 and each first branch portion 22 branches off the main strip 21 from an edge of the associated opening 29.

(Internal Structures of Main Strip 21 and Branch Strips)

Next, the internal structures of the main strip 21, the first branch portions 22, and the second branch portions 23 which constitute the circuit body 20 will be described with reference to FIG. 10 to FIGS. 13A-13C.

As described above, the main strip 21, the first branch portions 22, and the second branch portions 23 which constitute the circuit body 20 are an FPC. As shown in FIG. 11B, the circuit body 20 (FPC) consists of a resin layer 201 and a top metal layer 203a and a bottom metal layer 203b which are sandwiched by layers 201a, 201b and 201c of the resin layer 201. Typically, the resin layer 201 is made of polyimide and the top metal layer 203a and the bottom metal layer 203b are made of copper (Cu). As described later, in the embodiment, since the circuit body 20 is supported by the busbars 25, a reinforcement plate that is necessary conventionally to suppress curving etc. of the circuit body 20 can be omitted. In actuality, the circuit body 20 is provided with adhesive layers (not shown) for fixing the above layers to each other closely. However, the adhesive layers are not shown in FIG. 11B for the sake of convenience of description.

The top metal layer 203a which is located above (located on the front side of) the center plane, in the thickness direction, of the resin layer 201 and the bottom metal layer 203b which is located below (located on the back side of) the center plane, in the thickness direction, of the resin layer 201 are buried in the resin layer 201. The top metal layer 203a and the bottom metal layer 203b are spaced from each other in the thickness direction of the resin layer 201 and a layer 201b of the resin layer 201 is interposed between them. That is, the top metal layer 203a and the bottom metal layer 203b are insulated from each other.

The top metal layer 203a consists of top wiring patterns 204a which are part of the above-mentioned plural wiring patterns, top dummy patterns 205a which are independent of the top wiring patterns 204a, and the above-mentioned connection portions 24 which are independent of the top wiring patterns 204a.

The bottom metal layer 203b consists of bottom wiring patterns 204b which are the remaining part of the above-mentioned plural wiring patterns, bottom dummy patterns 205b which are independent of the bottom wiring patterns 204b. Corresponding ones of the top wiring patterns 204a and the bottom wiring patterns 204b are electrically connected to each other in the thickness direction of the circuit body 20 through a corresponding via hole 206.

Among the first branch portions 22 and the second branch portions 23 provided on the two sides in the width direction of the main strip 21, each set of a first branch portion 22 and a second branch portion 23 located on one side in the width direction (right side in each of FIGS. 12A and 12B) is connected to the connector 212 which is connected to the front end portion of the circuit body 20 because the corresponding top wiring pattern 204a extends continuously from a position in the vicinity of a terminal portion of the second branch portion 23 to the connector 212 via the second branch portion 23, the first branch portion 22, and the main strip 21.

The top dummy patterns 205a and the bottom dummy patterns 205b are formed in most of the area of the portion, housed in the holder 30, of the main strip 21 (i.e., the portion excluding the exposed portion 213) excluding the areas occupied by the top wiring patterns 204a and the bottom wiring patterns 204b. The top dummy patterns 205a and the top wiring patterns 204a and the bottom dummy patterns 205b and the bottom wiring patterns 204b are spaced from each other so as not to be electrically connected to each other. The top dummy patterns 205a and the bottom dummy patterns 205b are provided mainly for the purpose of making the stiffness of the portion, housed in the holder 30, of the main strip 21 (i.e., the portion excluding the exposed portion 213) higher than that of the first branch portions 22 and the second branch portions 23.

Figure 13A:
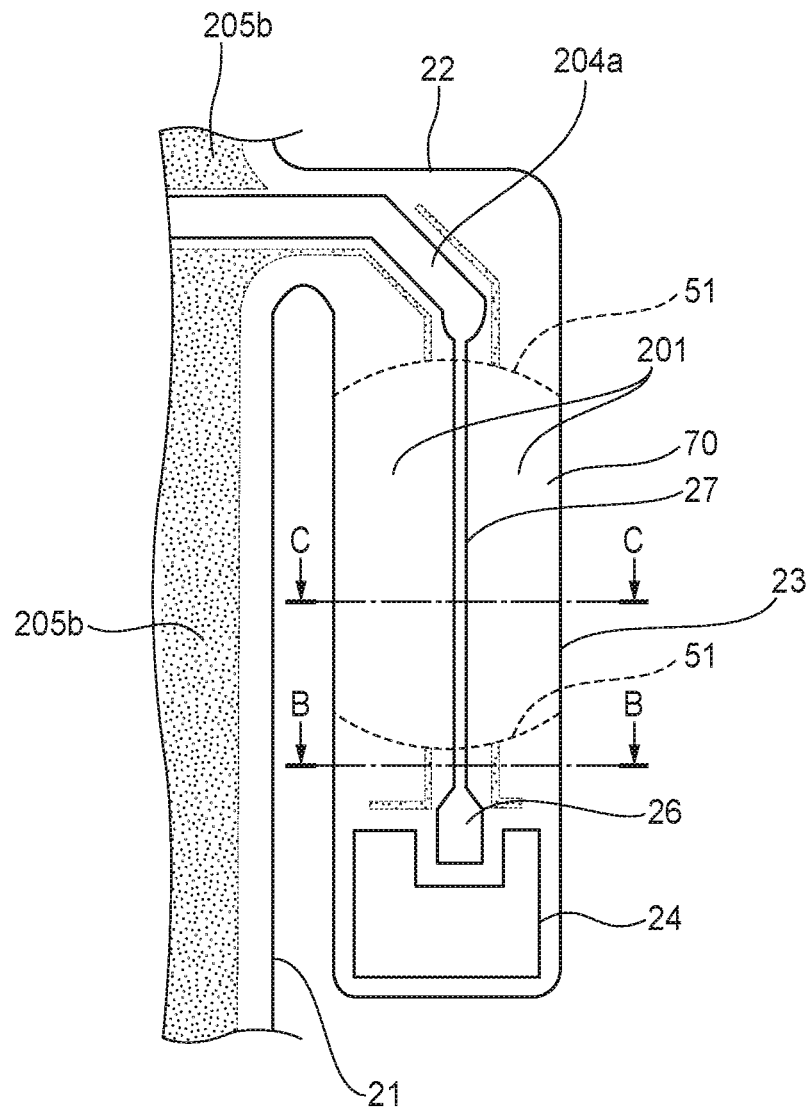
FIG. 13A is an enlarged sectional view of one branch strip and its neighborhood of the circuit body shown in FIG. 12A.

The terminal portion of the second branch portion 23 of each of all of the branch strips provided on the two sides of the main strip 21 in its width direction is formed with a connection portion 24. As shown in FIG. 13A, the connection portion 24 is spaced from a terminal portion 26 of the portion, located in the second branch portion 23, of the top wiring pattern 204a. As described later, the associated busbar 25 is connected to the connection portion 24 and a chip fuse 50 is disposed so as to bridge the terminal portion 26 and the connection portion 24 (see FIG. 10 etc.), whereby the busbar 25 is electrically connected to the connector 212.

As shown in FIG. 13A, the portion, located in the second branch portion 23, of the top wiring pattern 204a has a narrow line 27 which has a relatively small wiring pattern width (i.e., small sectional area). This increases the flexibility of the second branch portion 23. Furthermore, with this measure, even if an excess current flows through a particular wiring pattern for one of various reasons but the chip fuse 50 does not work, the narrow line 27 corresponding to the particular wiring pattern is fusion-cut by Joule heat generated by the excess current preferentially over the other portions of the wiring pattern. This prevents an event that another portion of the wiring pattern (in particular, a portion located in the area, where the top wiring patterns 204a are formed densely, of the main strip 21) is fusion-cut to cause adverse influences on neighboring interconnections etc. Since fusion-cut residues of the narrow line 27 are confined in the resin layer 201, an event that metal particles of the narrow line 27 are scattered to the neighborhood can be suppressed.

Figure 13B:
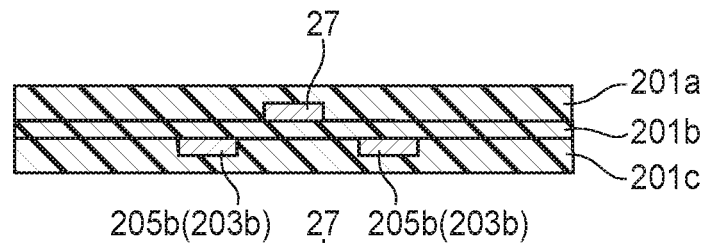
FIG. 13B is a B-B sectional view of FIG. 13A.
Figure 13C:
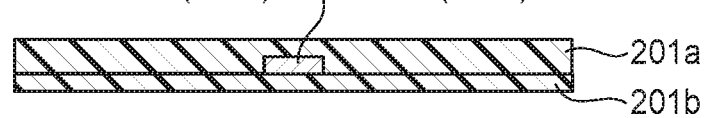
FIG. 13C is a C-C sectional view of FIG. 13A.

As shown in FIGS. 13B and 13C, a thin-layer portion 70 obtained by removing, from the flexible circuit board, a protective layer 201c corresponding to a conductive layer (that would otherwise become part of the pattern 205b shown in FIG. 13A) not used as a wiring pattern (narrow line 27) is formed in the second branch portion 23. The thin-layer portion 70 is at least part of the bent portion 231. Boundaries 51 between the thin-layer portion 70 and the portions other than the thin-layer portion 70 are curved so as to be convex toward the sides of the portions other than the thin-layer portion 70 in the longitudinal direction of the second branch portion 23.

(Specific Connection Form of Connection Piece 252 of Busbar 25 and Connection Portion 24 of Branch Strip)

Next, a specific connection form of the connection portion 24 of each second branch portion 23 and the connection piece 252 of the associated busbar 25 will be described with reference to FIG. 10 and FIGS. 11A and 11B.

Figure 10:
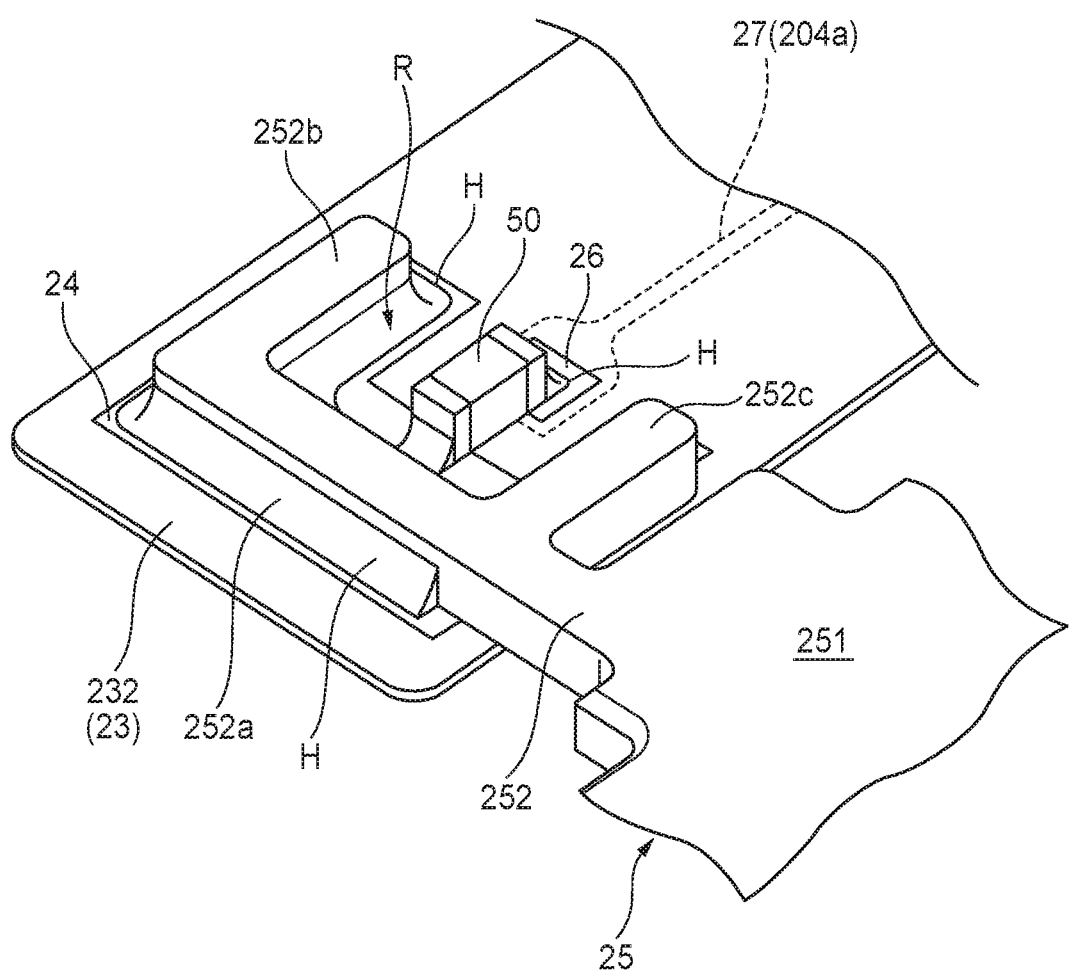
FIG. 10 is an enlarged perspective view of a portion where a connection piece of a busbar and a second branch portion are connected to each other and its neighborhood.
Figure 11A:
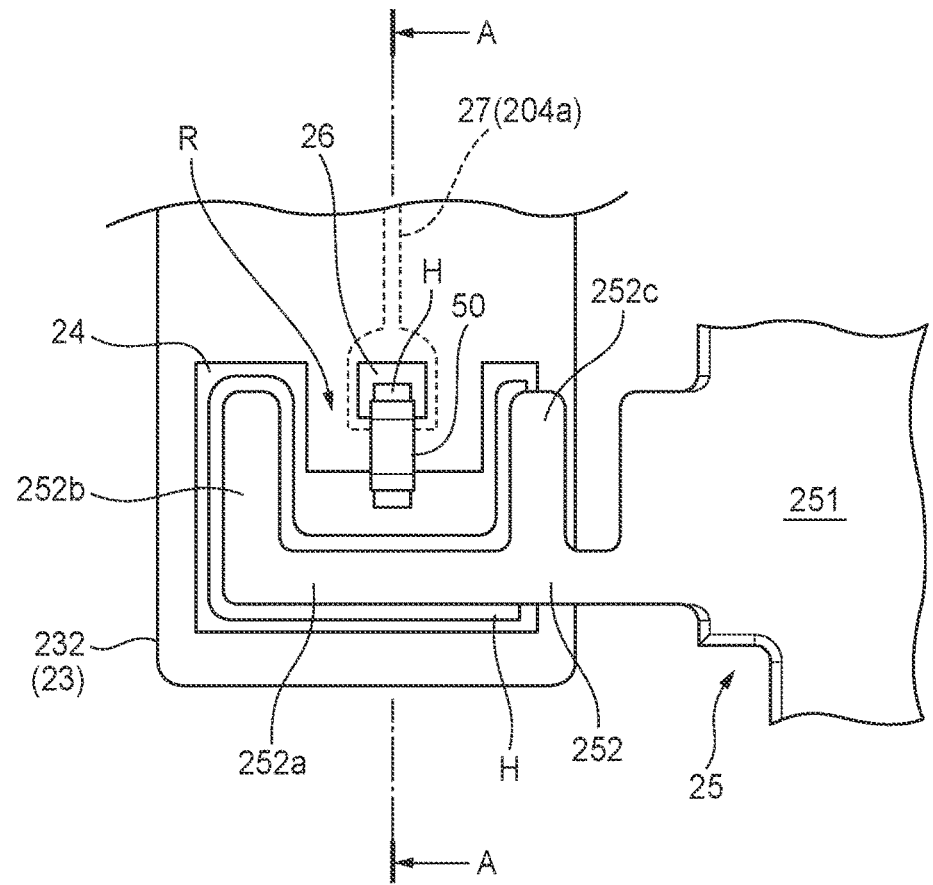
FIG. 11A is a top view of the connection portion and its neighborhood shown in FIG. 10
Figure 11B:
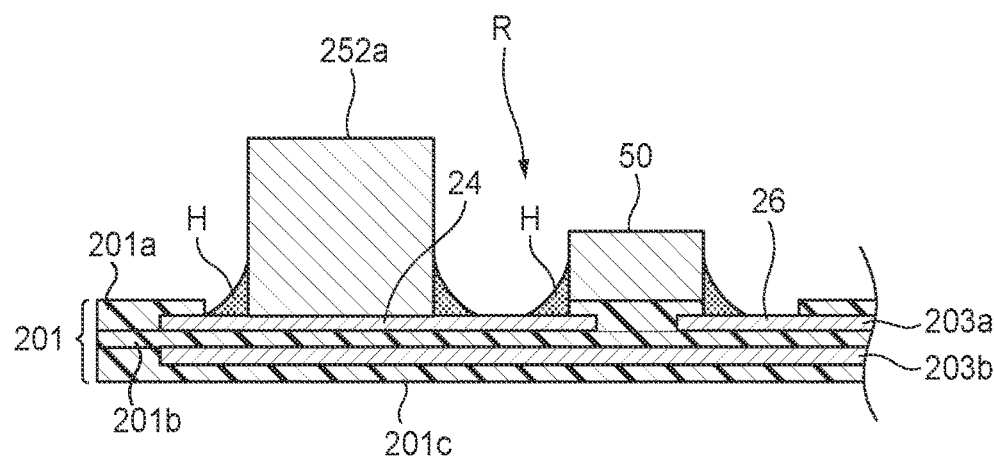
FIG. 11B is an A-A sectional view of FIG. 11A.
Figures 12A, 12B:
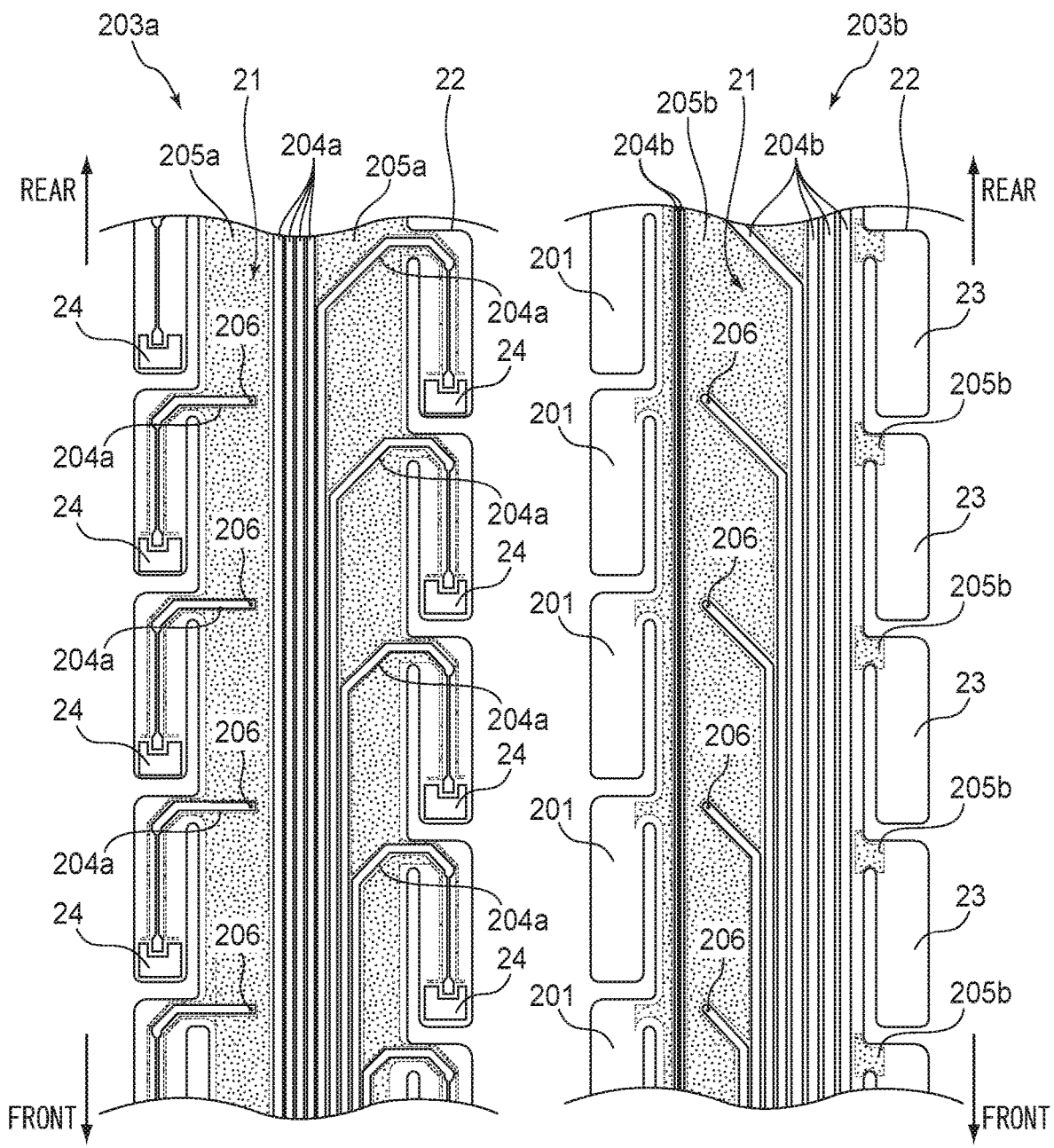
FIG. 12A is a sectional view, taken so as to include a top metal layer, of part of the circuit body
FIG. 12B is a sectional view, taken so as to include a bottom metal layer, of the same part of the circuit body.

As shown in FIG. 10 and FIGS. 11A and 11B, portions of the top layer of the resin layer 201 (see FIG. 11B) constituting the circuit body 20 are removed in the regions, corresponding to the connection portion 24 and the terminal portion 26, of the top surface of the tip portion 232 of each second branch portion 23. As a result, the connection portion 24 which is approximately U-shaped and the rectangular terminal portion 26 are exposed through openings that are open in the top surface of the tip portion 232.

The connection piece 252 of the busbar 25 is composed of a first portion 252a which extends from the busbar main body 251 inward in the width direction (i.e., toward the main strip 21) and a pair of second portions 252b and 252c which extend rearward from a tip portion and a base portion of the first portion 252a, respectively. As a result, the connection piece 252 is approximately shaped like U that is open at the rear end and corresponds to the shape of the exposed connection portion 24.

The connection piece 252 (first portion 252a and second portions 252b and 252c) is fixed to the top surface of the exposed connection portion 24 in such a manner that their approximately U-like shapes face each other. In this example, they are fixed to each other with solder H. As a result, the connection portion 24 and the busbar 25 are electrically connected to each other and a region (curving-restricted region) R where curving of the second branch portion 23 is restricted by utilizing high stiffness of the connection piece 252 is defined as a rectangular region located between the pair of second portions 252b and 252c.

In the curving-restricted region R, the chip fuse 50 is attached so as to bridge the terminal portion 26 and the connection portion 24. More specifically, one of electrodes formed at two respective end portions of the chip fuse 50 is fixed to the exposed connection portion 24 and the other electrode is fixed to the exposed terminal portion 26. In this example, the fixing is made using solder H. As a result, the connection portion 24 and the terminal portion 26 (i.e., busbar 25 and connector 212) are electrically connected to each other.

As described above, the curving-restricted region R is defined by the connection piece 252 of the busbar 25 and the chip fuse 50 is mounted in this region R. As a result, curving of the second branch portion 23 can be suppressed in the region where the chip fuse 50 is mounted, without using a reinforcement plate or the like.

The connection piece 252 may be shaped like L by removing the second portion 252c from the shape shown in FIG. 11A. As another alternative, the connection piece 252 may be shaped like a rectangle by adding, to the shape shown in FIG. 11A, a third portion 252d that connects tip portions of the pair of second portions 252b and 252c. As a further alternative, the connection piece 252 may be composed of two first portions 252a and 252e extending from the busbar main body 251. In any of these forms, curving of the second branch portion 23 can be suppressed in the region where the chip fuse 50 is mounted because the chip fuse 50 is attached in the curving-restricted region R which is set utilizing high stiffness of the connection piece 252.

Furthermore, utilizing the fact that the height of the connection piece 252 (first portion 252a and second portions 252b and 252c) is greater than that of the chip fuse 50 (see FIG. 11B), a potting compound 28 may be applied in the curving-restricted region R defined by the connection piece 252, so as to cover the chip fuse 50 and thereby isolate it from the outside.

Covering the chip fuse 50 with the potting compound as described above makes it possible to increase the waterproofness of the chip fuse 50 and the electric contacts around it. Furthermore, since the potting compound is solidified so as to be in close contact with the surface of the tip portion 232, curving of the second branch portion 23 can be suppressed further utilizing high stiffness of the potting compound. It is preferable that the potting compound be applied so as to cover the entire curving-restricted region R defined by the connection piece 252 of the busbar 25.

Main Advantages of Embodiment

As described above, in the busbar module 10 according to the embodiment, the circuit body 20 which is a flexible circuit board has the main strip 21 that can be put on the cells 2, the first branch strips 22 extending from the side edges of the main strip 21, and the second branch strips 23 that are connected to the respective first branch strips 22 and extend parallel with the stacking direction of the cells 2. Each of the second branch strips 23 has a bent portion 231 which is bent along axes L that cross the stacking direction. With this configuration, when each cell 2 expands and contracts repeatedly in its thickness direction (stacking direction) or the positions of the cells vary from one battery assembly 1 manufactured to another due to an assembling allowance of each cell 2, each busbar 25 can move in the thickness direction of the cells 2 because the bent portion 231 of the second branch strip 23 is bent or stretched. On the other hand, the bent portion 231 of the second branch strip 23 has a thin-layer portion 70 that is formed by removing, from the flexible circuit board, a portion of a protective layer 201c corresponding to a conductor layer 205b not used as a wiring pattern (narrow line 27). The thin-layer portion 70 increases the flexibility of the bent portion 231 and thereby facilitates the above bending and stretching.

As such, the busbar module 10 can easily accommodate expansion/contraction and manufacture dispersion of the battery assembly 1 because substantially only the branch strips 22 and 23 are deformed with no deformation of the main strip 21 of the circuit body 20. In general, even in the case where a flexible circuit board includes a number of circuit structures, it can be deformed flexibly by a much weaker force than the electric wires used in the above-described conventional busbar module. Thus, the ease of attachment of the circuit body 20 to battery assembly 1 the is increased remarkably. As such, the busbar module 10 is high in the ease of attachment to the battery assembly 1 and the followability to deformation and manufacture dispersion of the battery assembly 1.

Furthermore, in the busbar module 10 according to the embodiment, the boundaries 51 between the thin-layer portion 70 and portions other than the thin-layer portion 70 are curved so as to be convex toward the sides of the portions other than the thin-layer portion in the longitudinal direction of the second branch strip 23. With this measure, an event that excessive bending stress occurs in portions, located in the vicinity of the boundaries 51, of a wiring pattern 27 when the second branch strip 23 is bent at the boundaries 51 can be suppressed. As a result, the wiring patterns can be protected properly even if the thin-layer portion 70 is formed in each second branch strip 23.

Still further, a wiring pattern 27 passing through the thin-layer portion 70 is thinner than wiring patterns that pass through the portions other than the thin-layer portion 70 in the second branch strip 23. This measure increases the flexibility of the thin-layer portion 70 further.

Other Embodiments

The invention is not limited to the above embodiment and various modifications, improvements, etc. can be made as appropriate within the scope of the invention. The materials, shapes, sets of dimensions, numbers, locations, etc. of the respective constituent elements of the above embodiment are not limited to those disclosed but can be determined in desired manners as long as the invention can be implemented.

Features of the above-described busbar module 10 according to the embodiment of the invention will be summarized below concisely in the form of items [1] to [3]:
[1] A busbar module (10) to be attached to a battery assembly (1) having a stack of a plurality of cells (2), the busbar module (10) comprising:
a circuit body (20) having a flexible circuit board including wiring pattern (27)s; a plurality of busbars (25) to be connected to corresponding electrodes of the plurality of the cells (2); and a holder (30) holdings the busbars (25) and being extendable in a stacking direction of the plurality of the cells (2),
the circuit body (20) having:
a plurality of conductor layers (203a, 203b) and a plurality of protective layers (201) to form a multiple-layered structure of the wiring pattern (27)s;
a band-shaped main strip (21) to be located to extend in the stacking direction; and
a band-shaped branch strip branched from the main strip (21);
the branch strip having:
a bent portion (231) extending in the stacking direction and having a bent shape around an axis crossing the stacking direction; and a connection portion (24) disposed closer to an end of the branch strip than the bent portion (231) and connected to the corresponding busbar, the bent portion (231) having a thin-layer portion (70) having a shape formed by removing, from the flexible circuit board, a part of the protective layers (201) corresponding to a part of the conductor layers (203a, 203b) without being used as the wiring pattern (27) in the branch strip.

[2] The busbar module (10) according to the item [1], wherein the branch strip has a curved boundary shape between the thin-layer portion (70) and a portion other than the thin-layer portion (70) to be convex to separate from the thin-layer portion (70) in a longitudinal direction of the branch strip.

[3] The busbar module (10) according to the item [1] or the item [2], wherein a part of the wiring pattern (27) passing through the thin-layer portion (70) is thinner than others of the wiring pattern (27) passing through a portion other than the thin-layer portion (70).

REFERENCE SIGNS LIST

1: Battery assembly
2: Cell
3: Battery main body (main body)
4: Positive electrode
5: Negative electrode
10: Busbar module
20: Circuit body
21: Main strip
22: First branch portion (branch strip)
23: Second branch portion (branch strip)
201: Resin layer (protective layer)
205: Conductor layer
231: Bent portion
231A: First bent portion
231B: Second bent portion
24: Connection portion
25: Busbar
30: Holder
70: Thin-layer portion
L: Axis

The invention claimed is:

1. A busbar module to be attached to a battery assembly having a stack of a plurality of cells, the busbar module comprising:
   a circuit body having a flexible circuit board including wiring patterns;
   a plurality of busbars to be connected to corresponding electrodes of the plurality of the cells; and
   a holder holding the busbars and being extendable in a stacking direction of the plurality of the cells,
   the circuit body having:
   a plurality of conductor layers and a plurality of protective layers to form a multiple-layered structure of the wiring patterns;
   a band-shaped main strip to be located to extend in the stacking direction; and
   a band-shaped branch strip branched from the main strip, the branch strip having:
   a bent portion extending in the stacking direction and having a bent shape around an axis crossing the stacking direction; and
   a connection portion disposed closer to an end of the branch strip than the bent portion and connected to a corresponding one of the busbars,
   the bent portion having a thin-layer portion having a shape formed by removing, from the flexible circuit board, a part of the protective layers corresponding to a part of the conductor layers not being used as the wiring pattern in the branch strip,
   wherein a part of the wiring pattern passing through the thin-layer portion is thinner than other parts of the wiring pattern passing through a portion other than the thin-layer portion.

2. The busbar module according to claim 1, wherein
   the branch strip has a curved boundary shape between the thin-layer portion and a portion other than the thin-layer portion to be convex to separate from the thin-layer portion in a longitudinal direction of the branch strip.

* * * * *